(12) United States Patent
Ogura et al.

(10) Patent No.: US 7,951,458 B2
(45) Date of Patent: May 31, 2011

(54) COATING SOLUTION FOR FORMING FLAT-SURFACE INSULATING FILM, FLAT-SURFACE INSULATING FILM-COATED SUBSTRATE, AND PRODUCTION METHOD OF A FLAT-SURFACE INSULATING FILM-COATED SUBSTRATE

(75) Inventors: Toyoshi Ogura, Tokyo (JP); Noriko Yamada, Tokyo (JP); Yuji Kubo, Tokyo (JP)

(73) Assignee: Nippon Steel Materials Co., Ltd., Tokyo (JP)

( * ) Notice: Subject to any disclaimer, the term of this patent is extended or adjusted under 35 U.S.C. 154(b) by 51 days.

(21) Appl. No.: 12/450,646

(22) PCT Filed: Mar. 25, 2008

(86) PCT No.: PCT/JP2008/056267
§ 371 (c)(1),
(2), (4) Date: Oct. 1, 2009

(87) PCT Pub. No.: WO2008/126707
PCT Pub. Date: Oct. 23, 2008

(65) Prior Publication Data
US 2010/0048788 A1 Feb. 25, 2010

(30) Foreign Application Priority Data
Apr. 5, 2007 (JP) .................................. 2007-099624

(51) Int. Cl.
*B32B 9/04* (2006.01)
*C09D 183/06* (2006.01)
(52) U.S. Cl. .............. 428/447; 106/287.13; 106/287.16; 524/379; 524/385; 528/34; 428/689; 428/702
(58) Field of Classification Search ........................ None
See application file for complete search history.

(56) References Cited

U.S. PATENT DOCUMENTS
6,524,771 B2 * 2/2003 Maeda et al. ................. 430/290
2009/0250218 A1 * 10/2009 Akarsu et al. ................. 166/292

FOREIGN PATENT DOCUMENTS
| JP | 5-239359 | 9/1993 |
| JP | 2003-277042 | 10/2003 |
| JP | 2004-359953 | 12/2004 |
| JP | 2005-079405 | 3/2005 |
| JP | 2005-350519 | 12/2005 |
| WO | WO 2007/121972 | * 11/2007 |

OTHER PUBLICATIONS

Entitled "Preparation and Characteristics of High pH-resistant Sol Gel Alumina-based Hybrid Inorganic-Organic Coating for Solid-phase Microextraction of Polar Compounds" authored by, Liu et al. and published in Journal of Chromatography A (2206) 1108, 149-157.*
"Polydimethylsiloxane-based ORMOSIL microstructure: Correlation with Compressive Behavior" authored by Foussaier et al. and published Materials Letters (2000) 42, 305-310.*
"Effect of TiO2 on the Pore Structure of SiO2-PDMS Ormosils" authored by Rubio et al. and published in the Journal of Sol-Gel Science and Technology (2000) 18, 105-113.*
International Search Report dated Jul. 1, 2008 issued in corresponding PCT Application No. PCT/JP2008/056267.
Sumio Sakka, Sol-Gel Ho no Kagaku (Science of Sol-Gel Method), pp. 115-153, Agne Shofu Sha (1990).
Sumio Sakka, Sol-Gel Ho no Oyo (Application of Sol-Gel Method), pp. 57-115, Agne Shofu Sha (1997).

* cited by examiner

*Primary Examiner* — Marc S Zimmer
(74) *Attorney, Agent, or Firm* — Kenyon & Kenyon LLP

(57) ABSTRACT

A coating solution for forming a flat-surface insulating film, which is a coating solution obtained by dissolving a poly(diorgano)siloxane A having a mass average molecular weight of 900 to 10,000 and a metal alkoxide B in an organic solvent C and further adding water, wherein the molar ratio A/B of the poly(diorgano)siloxane A to 1 mol of the metal alkoxide B is from 0.05 to 1.5, the organic solvent C has a hydroxyl group, the solubility of water in 100 g of the organic solvent C is from 3 to 20 g, and the molar ratio C/A of the organic solvent C to 1 mol of the poly(diorgano)siloxane A is from 0.05 to 100. This coating solution for forming a flat-surface insulating film ensures that an organic modified silicate composed of a poly(diorgano)siloxane and a metal alkoxide can be formed as a thick film having 1 μm or more and can be an organic modified silicate insulating film causing no irregularities due to phase separation and having a low Young's modulus and flexibility high enough to follow the deformation of a substrate board, as well as high film surface flatness allowing for mounting of microcomponents of an electronic device or the like.

11 Claims, 2 Drawing Sheets

(a)

(b)

COATING

DRYING, HEAT TREATMENT (c)

COATING SOLUTION FOR FORMING FLAT-SURFACE INSULATING FILM, FLAT-SURFACE INSULATING FILM-COATED SUBSTRATE, AND PRODUCTION METHOD OF A FLAT-SURFACE INSULATING FILM-COATED SUBSTRATE

This application is a national stage application of International Application No. PCT/JP2008/056267, filed Mar. 25, 2008 which claims priority to Japanese Application No. 2007-099624, filed Apr. 05, 2007, which is incorporated by reference in its entirety.

TECHNICAL FIELD

The present invention relates to an organic modified silicate insulating film whose surface is flat. More specifically, the present invention relates to a flat-surface insulating film-coated substrate for use in the mounting of microcomponents of an electronic device, such as a thin-film transistor (TFT), an organic EL display and electronic paper, a coating solution for the flat-surface insulating film, and a production method for the flat-surface insulating film-coated substrate.

BACKGROUND ART

A silica ($SiO_2$) film is an inorganic oxide, and therefore is excellent in heat resistance, electrical insulation, etc., and is also easy to form as a flat film. For this reason, silica film is being used as an electrically insulating film in various fields. Also, silica film is produced by a gas phase method, such as PVD (Physical Vapor Deposition) or CVD (Chemical Vapor Deposition) or a liquid phase method, such as a sol-gel method. A device or electronic component arrangement requiring large electric field strength requires higher insulation, and the silica film needs to be made thicker. However, a thick film is difficult to form by any production method, and cracking usually occurs in a film having a thickness of 1 μm or more. This occurs because the Young's modulus of silica is high (about $10^5$ MPa) and the film cannot follow internal stress produced during film formation due to a difference in the thermal expansion coefficient from the substrate board material or internal stress produced by the shrinkage of the film, and also cannot reduce the stress. Furthermore, in the case of an electronic device having a curved shape or the like, as typified by electronic paper, a silica insulating film cannot follow the deformation because of its low flexibility (high Young's modulus).

In order to solve such a problem, an organic modified silicate film obtained by introducing an organic group into the siloxane skeleton of silica is known, and this is a film of a material also referred to as organic-inorganic hybrids, ormosils, ceramers or the like (see, Sumio Sakka, *Sol-Gel Ho no Kagaku (Science of Sol-Gel Method)*, pp. 115-153, Agne Shofu Sha (1990); and Sumio Sakka, *Sol-Gel Ho no Oyo (Application of Sol-Gel Method)*, pp. 57-115, Agne Shofu Sha (1997)). When an organic group, such as a methyl group is introduced into the siloxane skeleton, rigidity of the siloxane skeleton is reduced and the Young's modulus is decreased, so that even a film having 1 μm or more in thickness can be formed without cracking. This organic modified silicate film is generally produced by a sol-gel method. Using an organoalkoxysilane ($R_xSi(OR')_{4-x}$, wherein R is an organic group, OR' is an alkoxy group, and x is 1, 2 or 3) as a starting material, a structure where an organic group (—R) is introduced into the siloxane skeleton can be formed through the hydrolysis of the alkoxy group and the condensation reaction after the hydrolysis. In order to produce an organic modified silicate film having high flexibility, a poly(diorgano)siloxane X-[—Si(R)$_2$—O]$_m$—Si(R)$_2$—X (wherein X is a reactive functional group, and m is the number of organosiloxane units) is used as the starting material and is reacted together with an organoalkoxysilane or metal alkoxide M(OR)N (wherein n is the number of the alkoxy groups and is usually the valence of M). In particular, when the mass average molecular weight Mw is 900 or more, a thick film having 1 μm or more is easily produced and can be an insulating film having flexibility high enough to follow the deformation of the substrate board.

As for a material analogous to the organic modified silicate, in Japanese Unexamined Patent Publication (Kokai) No. 5-239359, a silicone resin composition composed of a chain silicone oligomer such as polydimethylsiloxane, a metal alkoxide and an inorganic filler is disclosed as an insulating coat layer for a heat-resistant insulated wire. Also, Japanese Unexamined Patent Publication (Kokai) No. 2005-79405 discloses, in relation to a thin-film solar cell substrate board, a method for forming an insulating film having formed on the surface thereof an irregular structure so as to enhance the light collection efficiency, where the surface irregular structure is formed utilizing a phase separation into a hydrophobic phase and a hydrophilic phase occurred in the film formed of a polydimethylsiloxane and a metal alkoxide.

DISCLOSURE OF THE INVENTION

In Japanese Unexamined Patent Publication (Kokai) No. 5-239359 above whose object is to form an insulating coat layer of a heat-resistant insulated wire having a small shrinkage ratio without using an organic solvent, addition of an inorganic filler to impart an appropriate hardness is an essential condition, and it is not suggested to apply the composition to a flat-surface insulating film for a microcomponent package of an electronic device in which an inorganic filler cannot be used. Even if applied, the inorganic filler is exposed to the film surface and forms irregularities, and a flat surface allowing for mounting of microcomponents of an electronic device cannot be formed. Also, in Patent JPP'405, phase separation into a hydrophobic phase and a hydrophilic phase is in the first place brought about at the sol stage and since the phase separation is made more distinct in the film-forming process to form an irregular structure on the surface, a flat surface can be hardly formed. It is indicated that the degree of irregularities is made small by such a heat treatment as accelerating the evaporation of the solvent, but only refinement of the texture by phase separation results and despite apparent transparency due to the cosolvent of the hydrophobic phase and hydrophilic phase, phase separation is generated already at the sol stage, making it fundamentally impossible to form an insulating film having surface flatness high enough to allow for application to mounting of microcomponents of an electronic device.

As for the organic modified silicate film formed from a poly(diorgano)siloxane and a metal alkoxide, when the mass average molecular weight Mw of the poly(diorgano)siloxane is 900 or more, the film can be formed as a thick film and has flexibility enabling to follow also the deformation of the substrate board, but, as described above, in the case of mounting microcomponents of an electronic device or the like on the film, if a conventional sol is used as the coating solution, this causes a problem of surface irregularities. A thin film of less than 1 μm in thickness is free from generation of the problematic irregularities, but if formed as a thick film of 1 μm or more, as described in Japanese Unexamined Patent Publication (Kokai) No. 2005-79405, the film surface becomes prominently uneven. Accordingly, in the case of the conventional coating solution and production method, for forming an insulating thick film usable in the mounting of microcomponents of an electronic device, when the film is formed to a thickness of 1 μm or more so as to endure high breakdown voltage, there arises a problem that even if the substrate board is smooth, large irregularities are produced in the film surface and components cannot be mounted.

The present invention is made to solve these problems and provides a coating solution for forming a flat-surface insulating film, ensuring that an organic modified silicate composed of a poly(diorgano)siloxane having a mass average molecular weight Mw of 900 or more and a metal alkoxide can be formed as a thick film of 1 μm or more and can work out to an organic modified silicate insulating film having a low Young's modulus and flexibility enabling to follow also the deformation of a substrate board as well as high film surface flatness allowing for mounting of microcomponents of an electronic device or the like; a method for producing a flat-surface insulating film-coated substrate by using the coating solution; and a flat-surface insulating film-coated substrate.

As a result of intensive studies on the surface irregularities of an organic modified-silicate film formed from a poly(diorgano)siloxane and a metal alkoxide so as to solve the problems above, the present inventors have found that there are the following causes.

When the surface geometry of an organic modified silicate film having a thickness of 1 μm or more formed from a poly(diorgano)siloxane and a metal alkoxide is observed by an electron microscope (SEM), the surface is found to have a wrinkle-like lamellar structure (FIG. 1) analogous to that described in Japanese Unexamined Patent Publication (Kokai) No. 2005-79405 and fail in achieving flatness. FIG. 1 shows the surface of a film with a thickness of 12 μm formed from a polydimethylsiloxane having a mass average molecular weight Mw of 4,500 and a metal alkoxide, that is, titanium isopropoxide ($Ti(OC_3H_7^i)_4$). In this lamellar structure, the content of the inorganic component formed from the metal alkoxide is not uniform in the film surface, but a region with a large inorganic component content and a region with a small content are present and these regions are corresponding to the pattern of the lamellar structure. As shown in FIG. 2(a), a phase rich in the inorganic component $P_{I-rich}$ (2) and a phase poor in the inorganic component $P_{I-poor}$ (3) are dissolved in an organic solvent (1) of a sol used as the coating solution (in the sol, the phase-separated state cannot be recognized with an eye), and as shown in FIG. 2(b), after coating on a substrate (6), the phase rich in the inorganic component $P_{I-rich}$ (4) and the phase poor in the inorganic component $P_{I-poor}$ (5) are separately gathered into respective phase aggregations to cause microphase separation without intermixing. As shown in FIGS. 2(b) and (c), respective phases exhibit different shrinkage ratios on hardening and while a phase with a large shrinkage ratio (in general, a phase having a large inorganic component content) forms a recess (7), a phase with a small shrinkage ratio (in general, a phase having a small inorganic component content) forms a projection (8), whereby a lamellar structure with irregularities is created in the film surface.

Accordingly, it is believe that when a sol incapable of producing such two or more unmixable phases is used as the coating solution, the film surface will become flat, and studies are intensively made based on this belief. That is, the key is not to produce a phase A having a large inorganic component content and a phase B having a small inorganic component content.

In the formation of an organic modified silicate from a poly(diorgano)siloxane and a metal alkoxide, the alkoxy group of the metal alkoxide is hydrolyzed and chemically bonded or hydrogen-bonded to the poly(diorgano)siloxane, whereby poly(diorgano)siloxanes are inorganically crosslinked. However, when the mass average molecular weight Mw of the poly(diorgano)siloxane becomes 900 or more and the linear siloxane chain elongates, the proportion of the hydrophobic moiety occupying in the solution is increased and therefore, water added in the hydrolysis is not swiftly and uniformly diffused in the entire solution, making it difficult for the hydrolysis of the metal alkoxide to simultaneously and uniformly occur in the entire solution. In turn, it is impossible for all poly(diorgano)siloxanes in the solution to be inorganically crosslinked to the same degree. As a result, a phase having a large inorganic component content $P_{I-rich}$ and a phase having a small inorganic component content $P_{I-poor}$ are formed, and these poorly compatible phases are found to be a cause bringing about phase separation.

The present inventors have further expanded the studies and experiments based on this finding, as a result, it has been found that when the ratio of the metal alkoxide to the poly(diorgano)siloxane is increased and an organic solvent phase capable of appropriately dissolving water is used, a coating solution enabling it to prevent the formation of a lamellar structure in the surface and form a thick organic modified silicate film having a flat surface can be obtained. This finding has lead to the present invention.

That is, the gist of the present invention resides in the followings.

(1) A coating solution for forming a flat-surface insulating film, which is a coating solution obtained by dissolving a poly(diorgano)siloxane A having a mass average molecular weight of 900 to 10,000 and a metal alkoxide B in an organic solvent C and further adding water, wherein the molar ratio A/B of the poly(diorgano)siloxane A to 1 mol of the metal alkoxide B is from 0.05 to 1.5, the organic solvent C has a hydroxyl group, the solubility of water in 100 g of the organic solvent C is from 3 to 20 g, and the molar ratio C/A of the organic solvent C to 1 mol of the poly(diorgano)siloxane A is from 0.05 to 100.

(2) The coating solution for forming a flat-surface insulating film as described in (1), wherein the carbon number of the organic solvent C is from 4 to 9.

(3) The coating solution for forming a flat-surface insulating film as described in (1) or (2), wherein the metal element of the metal alkoxide B is one or more elements selected from trivalent or tetravalent metal elements.

(4) The coating solution for forming a flat-surface insulating film as described in any one of (1) to (3), wherein the poly(diorgano)siloxane A contains a dimethyl siloxane structural unit (—[Si(CH$_3$)$_2$—O]—) in a ratio of 50 to 100% in terms of the molar ratio of Si.

(5) The coating solution for forming a flat-surface insulating film as described in any one of (1) to (4), wherein the mass average molecular weight Mw of the poly(diorgano)siloxane A is from 950 to 3,000.

(6) The coating solution for forming a flat-surface insulating film as described in any one of (1) to (5), wherein the molar ratio A/B is from 0.2 to 0.8.

(7) The coating solution for forming a flat-surface insulating film as described in any one of (1) to (6), wherein the molar ratio C/A is from 0.1 to 60.

(8) The coating solution for forming a flat-surface insulating film as described in any one of (1) to (7), wherein the combination of the poly(diorgano)siloxane A and the metal alkoxide B is a combination of a silanol-terminated (both ends) polydimethylsiloxane, a carbinol-terminated (both ends) polydimethylsiloxane, or both a silanol-terminated (both ends) polydimethylsiloxane and a carbinol-terminated (both ends) polydimethylsioloxane, with titanium alkoxide.

(9) A production method of a flat-surface insulating film-coated substrate, comprising coating the coating solution for forming a flat-surface insulating film described in any one of (1) to (8) above on a substrate, and subjecting the coating to drying at 60 to 200° C. and then to a heat treatment at 250 to 400° C.

(10) A flat-surface insulating film-coated substrate comprising a substrate having coated on the surface thereof an organic modified silicate insulating film formed from a poly(diorgano)siloxane A having a mass average molecular weight of 900 to 10,000 and a metal alkoxide B, wherein the molar ratio A/B of the poly(diorgano)siloxane B to 1 mol of the metal alkoxide A is from 0.05 to 1.5, the thickness of the film is from 1 to 50 μm, the Young's modulus of the film is from 10 to $10^3$ MPa, and the surface flatness Rq of the film is 20 nm or less.

(11) The flat-surface insulating film-coated substrate as described in (10), wherein the poly(diorgano)siloxane contained in the organic modified silicate film contains a dimethylsiloxane structural unit (—[Si($CH_3$)$_2$—O]—) in a ratio of 50 to 100% in terms of the molar ratio of Si.

BEST MODE FOR CARRYING OUT THE INVENTION

Figure 1:
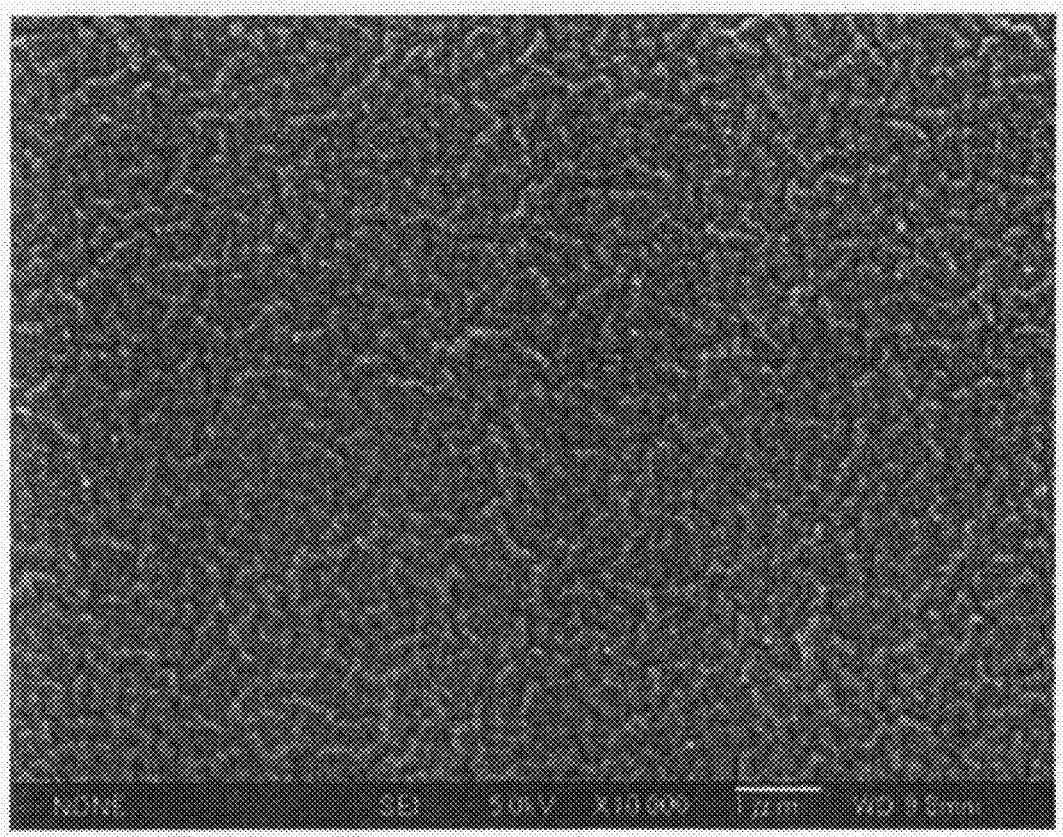
FIG. 1 is one example of the electron micrograph of a surface with wrinkle-like irregularities of a thick organic modified silica film formed from a poly(diorgano)siloxane and a metal alkoxide.
Figure 2:
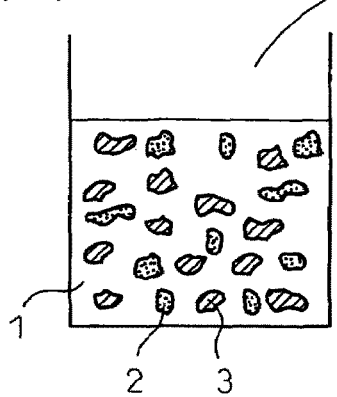
FIG. 2 is a conceptual view showing the process of a surface with wrinkle-like irregularities being formed in a thick organic modified silica film formed from a poly(diorgano)siloxane and a metal alkoxide.
Figure 2:
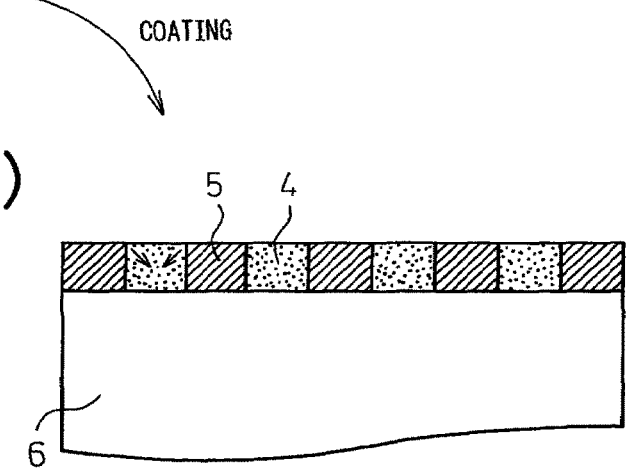
Figure 2:
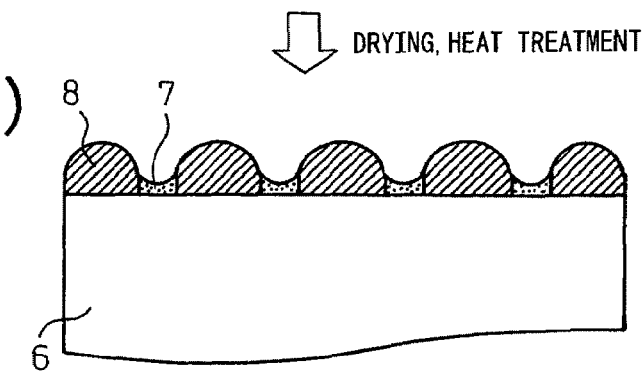

The poly(diorgano)siloxane A for use in the present invention is a compound where two organic groups are bonded to Si and siloxanes Si—O are continuously and linearly connected, and is represented by the formula: X-[—Si(—R)$_2$—O—]$_m$—Si(R)$_2$—X, wherein X is a reactive functional group, —R is an organic group directly bonded to Si, and m is a polymerization degree and, for example, is approximately from 19 to 20 when the mass average molecular weight Mw is 1,000 and the organic group R is a methyl group.

Preferred examples of the organic group (organo group, —R) include an alkyl group such as methyl group, ethyl group and propyl group, an alicyclic hydrocarbon group such as cyclohexane group, and an aromatic hydrocarbon group such as phenyl group and benzyl group. That is, examples of the poly(diorgano)siloxane A include poly(dimethyl)siloxane, poly(diethyl)siloxane, poly(dipropyl)siloxane, poly(diphenyl)siloxane, poly(dibenzyl)siloxane, poly(dimethyl)(diphenyl)siloxane and poly(dimethyl)(dibenzyl)siloxane.

For effectively reducing the Young's modulus of the organic modified silicate film, it is more preferred that the poly(diorgano)siloxane contains —(Si(—R)$_2$—O)—, particularly (—[Si($CH_3$)$_2$—O]—), in a ratio of 50 to 100% in terms of the molar ratio of Si.

The reactive functional group (—X) in the dimethylsiloxane structural unit may be sufficient if it is a functional group that reacts with the metal alkoxide, and examples thereof include a silanol group, a carbinol group, an amino group, an alkoxy group, a mercapto group, a phenol group, a carboxyl group, a polyether group, a methacrylic group and an epoxy-containing functional group.

The mass average molecular weight Mw of the poly(diorgano)siloxane A is 900 or more. If the mass average molecular weight is less than 900, a film whose surface is flat may be obtained with no occurrence of phase separation but a thick film of 1 μm or more cannot be formed, that is, because of its small film thickness, the film cannot be used as an insulating thick film requiring high breakdown voltage. In a poly(diorgano)siloxane having Mw of less than 900, the hydrophobic part comes to occupy a small volumetric ratio with respect to the hydrophilic part and therefore, when reacted with a metal oxide, hydrolysis of the metal alkoxide uniformly proceeds in the entire solution, and poly(diorgano)siloxanes can be inorganically crosslinked in a uniform manner, as a result, phase separation does not occur and a flat surface is formed. However, the small mass average molecular weight Mw of the poly(diorgano)siloxane makes low the solution viscosity or the viscosity at the film formation and a thick film cannot be formed. Furthermore, since the siloxane chain is short, the film lacks flexibility (the Young's modulus becomes high) and when a thick film is formed, cracking is generated. For producing a thick film of 1 μm or more, this may be attained by using a poly(diorgano)siloxane having Mw of 900 or more. On the other hand, if Mw exceeds 10,000, the poly(diorgano)siloxane is viscous and can hardly dissolve in a solvent, making it impossible to be mixed with a metal alkoxide, and a coating solution cannot be prepared. More preferably, Mw is from 950 to 3,000.

A thick film of 1 μm or more can be produced by using a poly(diorgano)siloxane having Mw of 900 or more, but as described above, surface irregularities become conspicuous due to formation of a lamellar structure, and a flat surface is not obtained. However, when an organic solvent C having a hydroxyl group is used and when the solubility of water in 100 g of the organic solvent C is from 3 to 20 g and the molar ratio C/A of the organic solvent C to 1 mol of the poly(diorgano)siloxane A is from 0.05 to 100, a coating solution being free from phase separation and allowing no production of a lamellar structure after film formation can be obtained. Here, the molar ratio C/A is calculated using the mass average molecular weight Mw of the poly(diorguano)siloxane A and the molecular weight Ms of the organic solvent C according to Molar ratio C/A=($X_C$/MS)/($X_A$/Mw) (wherein $X_C$ is the mass of the organic solvent C, and $X_A$ is the mass of the poly(diorgano)siloxane A).

If the solubility of water in 100 g of the organic solvent C above is less than 3 g, the water added is not swiftly and uniformly diffused in the entire solution and in turn, hydrolysis of the metal alkoxide does not uniformly occur in the entire solution, as a result, a phase having a large inorganic component content and a phase having a small inorganic component content are formed in the solution and when the solution is coated to form a film, phase separation is brought about, developing conspicuous irregularities in the surface. On the other hand, if the solubility of water in 100 g of the organic solvent C exceeds 20 g, the poly(diorgano)siloxane cannot be sufficiently dissolved and therefore, the hydrolyzed metal alkoxide fails in uniformly crosslinking poly(diorgano)siloxanes, as a result, a phase having a large inorganic component content and a phase having a small inorganic component content are formed in the solution and when the solution is coated to form a film, phase separation is brought about, developing conspicuous irregularities in the surface.

Also, the organic solvent C needs to have a hydroxyl group, so that the metal alkoxide and the hydrolyzed metal alkoxide can be solvated between hydrolysis of the metal alkoxide B and crosslinking of poly(diorgano)siloxanes A.

Examples of the organic solvent C include propyl alcohol ($CH_3CH_2CH_2OH$), n-butyl alcohol ($CH_3CH_2CH_2CH_2OH$), isobutyl alcohol (($CH_3)_2CHCH_2OH$), s-butyl alcohol ($CH_3CH_2CH(CH_3)$ OH), n-pentyl alcohol ($CH_3 (CH_2)_4OH$), isopentyl alcohol (($CH_3)_2CHCH_2CH_2OH$), neopentyl alcohol (($CH_3)_3CCH_2OH$), n-hexyl alcohol ($CH_3(CH_2)_5OH$), n-heptyl alcohol ($CH_3(CH_2)_6OH$), n-octyl alcohol ($CH_3(CH_2)_7OH$), n-nonyl alcohol ($CH_3(CH_2)_8OH$), isononyl alcohol (($CH_3)_2CH(CH_2)_6OH$), n-decyl alcohol ($CH_3(CH_2)_9OH$), diethylene glycol monohexyl ether ($CH_3(CH_2)_5O(CH_2CH_2O)_2H$), ethylene glycol monohexyl ether ($CH_3(CH_2)_5OCH_2CH_2OH$), propylene glycol mono-n-butyl ether ($CH_3(CH_2)_3OCH_2CH(CH_3)OH$), 3,5,5-trimethyl-1-hexanol ($CH_3C(CH_3)_2CH_2CH(CH_3)CH_2CH_2OH$), 2-ethyl-1-hexanol ($CH_3(CH_2)_3CH(CH_2CH_3)CH_2OH$), and isodecanol (($CH_3)_2CH(CH_2)_7OH$).

Furthermore, if the molar ratio C/A is less than 0.05, the proportion of the poly(diorgano)siloxane A occupying in the solution becomes excessively large and because of hydrophobicity of the poly(diorgano)siloxane A, the water added is not allowed to swiftly and uniformly diffuse in the entire solution. In turn, hydrolysis of the metal alkoxide B does not uniformly occur in the entire solution, as a result, a phase having a large inorganic component content and a phase having a small inorganic component content are formed in the solution and when the solution is coated to form a film, phase separation is brought about, developing conspicuous irregularities in the surface. On the other hand, if the molar ratio C/A exceeds 100, the above-described two phases are not formed and no phase separation is brought about, but the solid content concentration as a coating solution becomes low and a thick film cannot be formed. More preferably, the molar ratio C/A is from 0.1 to 60. The carbon number of the organic solvent is preferably from 4 to 9. If the carbon number is less than 4, the vapor pressure may rise and it may be sometimes difficult to form a film, whereas if it exceeds 9, the vapor pressure may lower and the solvent may remain in the film after film formation.

In the present invention, the above-described organic solvent C is used and the molar ratio A/B of the poly(diorgano)siloxane A to 1 mol of the metal alkoxide B is specified to be from 0.05 to 1.5, whereby a coating solution free from occurrence of phase separation and capable of forming a thick film having a flat surface without formation of a lamellar structure in the surface is obtained. Here, the molar ratio A/B is calculated using the mass average molecular weight Mw of the poly(diorgano)siloxane A and the molecular weight Ma of the metal alkoxide B according to Molar ratio $A/B=(X_A/Mw)/(X_B/Ma)$ (wherein $X_B$ is the mass of the metal alkoxide B and $X_A$ is the mass of the poly(diorgano)siloxane A).

If the molar ratio A/B exceeds 1.5, the hydrophobic part of the poly(diorgano)siloxane A comes to occupy a large proportion in the solution and uniform diffusion of the water added for hydrolysis is hindered from sufficiently proceeding, making it difficult to allow the hydrolysis of the metal alkoxide B to simultaneously and uniformly occur in the entire solution, as a result, a phase having a large inorganic component content and a phase having a small inorganic component content are formed. When the molar ratio above is 1.5 or less, the hydrophobic part of the poly(diorgano)siloxane comes to occupy a small proportion in the solution and the water added for the hydrolysis of the metal alkoxide B diffuses in the entire solution to allow no formation of such two kinds of phases different in the inorganic component content as causing the above-described phase separation, as a result, even when a thick film is formed, a lamellar structure is not produced and a flat film can be obtained. On the other hand, if the molar ratio A/B is less than 0.05, phase separation does not occur, but the content of inorganic components is increased and because of poor flexibility of the film (high Young's modulus), cracking is generated during production of a thick film. More preferably, the molar ratio A/B is from 0.2 to 0.8.

The metal alkoxide B for use in the present invention is represented by the formula: $M(OR')_n$. Examples of the metal element M include one or more elements selected from Mg, Ca, Y, Al, Si, Sn, Ti, Zr, Nb, Ta and W, and examples of the alkoxy group OR' include a methoxy group, an ethoxy group, a propoxy group and a butoxy group. In particular, for effectively crosslinking poly(diorgano)siloxanes A, the metal element of the metal alkoxide B is preferably one or more members selected from trivalent or tetravalent metal elements. That is, the metal alkoxide tends to uniformly react with the poly(diorgano)siloxane in the solution and cause no phase separation. As for the metal alkoxide of Y, Al, Sn, Ti, Zr, Nb, Ta or W, since they have high reactivity, an alkoxide derivative obtained by substituting a part of the alkoxy group with a chemical modifier such as β-diketone, β-ketoester, alkanolamine, alkylalkanolamine or organic acid may be used.

As described above, the thickness of the flat-surface insulating film composed of an organic modified silicate of the present invention needs to be 1 μm or more for obtaining a high breakdown voltage. The insulating film can be preferably produced to a thickness of 2 μm or more or a thickness of 3 μm or more and can also be preferably produced even to a thickness of 5 μm or more. If the film thickness exceeds 50 μm, the breakdown voltage is sufficiently high but the film thickness is larger than necessary and this not profitable. In general, the film thickness is preferably 25 μm or less. The breakdown voltage as used in the present invention is determined by the following measurement. A platinum electrode of 1 cm×1 cm is vapor-deposited on an insulating film, a voltage is variably applied using the electrode as a plus pole and the film-attached substrate board side as a minus pole, and the breakdown voltage is judged by the voltage at which a current of 1 mA or more does not flow for 10 seconds. The breakdown voltage is preferably 1 kV or more, more preferably 2.5 kV or more.

In order to obtain the above-described breakdown voltage, the insulation resistance of the insulating film is suitably at least $10^6$ $\Omega cm^2$ or more. In the case of use for an electronic substrate board where a wiring pattern circuit is fabricated on the film and stacked, if the insulation resistance is less than $10^6$ $\Omega cm^2$, even when a thick film is formed, the current flowing through the circuit patterned on the film may leak to the substrate board and a high breakdown voltage may not be obtained. For obtaining a high breakdown voltage, it is important to form a film having a high insulation resistance, a large film thickness and a small number of defects.

The flat-surface insulating film composed of an organic modified silicate of the present invention is formed as a thick film of 1 μm or more and therefore, must have a low Young's modulus so that the film can follow the deformation of the substrate board. That is, the Young's modulus is $10^3$ MPa or less and if it exceeds this range, a thick film of 1 μm or more cannot be formed or cracking is generated in the course of forming a film. On the other hand, if the Young's modulus is less than 10 MPa, the film is too soft and can be hardly subjected to lithography, and an electronic device cannot be mounted on the film serving as an insulating film. The Young's modulus of the film is measured together with the hardness by a microhardness tester.

In the present invention, a preferred example of the combination of the poly(diorgano)siloxane A and the metal alkoxide B is a combination of a silanol-terminated (both ends) polydimethylsiloxane, a carbinol-terminated (both ends) polydimethylsiloxane, or both a silanol-terminated (both ends) polydimethylsiloxane and a carbinol-terminated (both ends) polydimethylsioloxane, with titanium alkoxide. For example, when the polydimethylsiloxane has Mw of about 5,000 and the polydimethylsiloxane/titanium alkoxide molar ratio is about 0.4, a flat film having a film thickness of 4 μm or more is obtained through dip coating and heat treatment and at the same time, this film works out to an insulating film being free of cracking and having a high breakdown voltage of 2 kV or more. In order to stably obtain electrical insulation of 1 kV or more, an insulating film having a film thickness of 1 μm or more is necessary, and the film thickness is increased for more raising the insulation.

In the insulating film of the present invention, the surface flatness (surface roughness) Rq is 20 nm or less. If Rq exceeds 20 nm, this hinders applying microcomponents or wiring on the insulating film. The square mean roughness Rq (Rms) indicative of the surface flatness represents an average amplitude in the height direction, which is a square root of the value obtained by averaging the square of deviation from an average line between reference lengths (L) to a measured curve and can be determined according to the following formula (I):

$$Rq = \sqrt{\frac{1}{L}\int_0^L F^2(x)\,dx} \quad (1)$$

For example, Rq can be determined from formula (I) by measuring the inside of 15 μm×15 μm on the film. The square mean roughness Rq is an index capable of more clearly indicating the difference in the degree of surface irregularities (amplitude of ridges and troughs) compared with the arithmetic average roughness Ra that is a parameter indicative of the average amplitude in the height direction. Accordingly, it has been found that in the usage requiring a surface having an extremely high flatness so as to mount microcomponents of an electronic device, unless Rq is 20 nm or less when the surface flatness is judged by Rq, the film cannot be applied. More preferably, the square average roughness is 15 nm or less.

In the insulating film of the present invention, the decrease in mass when heated to 600° C. is preferably 10% or less. More specifically, in the case of use as the substrate board of an electronic device such as TFT and electronic paper, the substrate board is heated in various processes of mounting microcomponents, and volatilization from the substrate board under heating is preferably as little as possible. If the decrease in mass when heated to 600° C. exceeds 10%, the volatilized portion is large and the volatilized gas may become an inhibitor of the production.

The hydrolysis is preferably performed by added water in a ratio of 0.5 to 2 times to the molar number of all alkoxy groups in the starting material. If the ratio is less than 0.5 times, the hydrolysis may proceed at a low rate and gelling may take much time, whereas if it exceeds 2 times, the percentage of condensation between metal alkoxides may be increased and contribution to effective crosslinking of siloxane polymers may be sometimes reduced.

The insulting film of the present invention can be produced by a sol-gel method and can be produced by a process of coating a sol coating solution and subjecting the coating film to drying and heat treatment. The drying is performed mainly for the purpose of removing the solvent in the coating film, and the drying temperature is preferably from 60 to 200° C. If the drying temperature is less than 60° C., the drying may take much time and a large amount of the solvent may remain in the film, whereas if it exceeds 200° C., the dried film may collapse due to abrupt evaporation of the solvent. Also, the primary purpose of the heat treatment is to allow curing of the coating film to proceed, and the heat treatment temperature is preferably from 250 to 600° C. If the heat treatment temperature is less than 250° C., practical strength as an insulating film may not be obtained, whereas if it exceeds 600° C., thermal decomposition of the organic group bonded to siloxane may occur to impair the flexibility of the film.

The sol may be coated on a substrate board by a bar coating method, a roll coating method, a spray coating method, a dip coating method, a spin coating method, a slit coating method, a curtain coating method or the like. The insulating film of the present invention is formed by a wet process as described above and while a large number of silanol (SiOH) groups are present in the film in the wet state immediately after film formation, when the film is cured by a heat treatment, an inorganic component formed by the hydrolysis/condensation reaction of the metal alkoxide B upon the heat treatment crosslinks poly(diorgano)siloxanes A through a chemical bond or a hydrogen bond.

The substrate of the flat-surface insulating film of the present invention is not particularly limited, but examples thereof include an electrically conductive substrate such as stainless steel (e.g., SUS304, SUS430, SUS316), common steel, plated steel, aluminum, nickel, titanium and silicon. Also, the shape of the substrate is not particularly limited, but examples thereof include a plate and a foil.

The coating solution for forming a flat-surface insulating film of the present invention can form an insulating film composed of an organic modified silicate, where since a phase rich in the inorganic component and a phase poor in the inorganic component are not present in a sol working out to the coating solution, the film surface is free from production of irregularities due to phase separation occurring in the course of forming the film and even when the film thickness is increased, a surface with high flatness can be obtained. Also, according to the production method using the coating solution for forming a flat-surface insulating film of the present invention, a surface-flat insulating film having flexibility (low Young's modulus) to allow the film to follow the deformation of a flexible substrate without separation or cracking and having a flat surface enabling it to unfailingly mount microcomponents is obtained. That is, the substrate coated with the flat-surface insulating film can be suitably used as an electrically insulating film-coated substrate requiring flexibility, high breakdown voltage and heat resistance, more specifically, as a substrate coated with a thick insulating film, which is used in the field requiring a surface having very high flatness so as to mount electronic device microcomponents, for example, in an electronic device such as thin-film transistor (TFT), liquid crystal display, organic EL display and electronic paper.

EXAMPLES

The contents and results of tests performed in practice by the present inventors are descried below.

Example 1

Polydimethylsiloxane (with the terminal group being silanol) was used as the poly(diorgano)siloxane A and titanium tetraisopropoxide was used as the metal alkoxide B. As for production conditions, the mass average molecular weight Mw of polydimethylsiloxane, the molar ratio A/B of the poly(diorgano)siloxane A to 1 mol of the metal alkoxide B, the kind of the organic solvent C, the solubility of water in 100 g of the organic solvent C, and the molar ratio C/A of the organic solvent C to 1 mol of the poly(diorgano)siloxane A are shown in Table 1. Ethyl-3-oxobutanoate as a chemical modifier for the metal alkoxide and titanium tetraisopropoxide were mixed in a molar ratio of 2:1, polydimethylsiloxane was added to the resulting mixture and after further adding an organic solvent to the mixture, $H_2O$ for causing hydrolysis was added to produce a coating solution. The amount of $H_2O$ added here was 1.9 mol per mol of the metal alkoxide. In No. 24 of Comparative Example of Table 1, an organic modified silicate film was produced from a mixture containing 10 mol of dimethoxysilane and 10 mol of tetraethoxysilane as starting materials. After adding 20 mol of ethanol, the mixture above was thoroughly stirred, and an aqueous acetic solution prepared by mixing 2 mol of acetic acid and 100 mol of water was added dropwise with stirring to perform hydrolysis. To the thus-obtained solution, 200 mol of ethanol was added to produce a final coating solution.

The coating solution produced through the procedure above was coated on an SUS430 substrate board by dip coating at a pulling rate of 3 mm/sec. After the coating, the coating film was dried at 150° C. and 200° C. each for 10 minutes and then heat-treated at 300° C. for 6 hours to produce an insulating film. The surface of this insulating film was observed by an electron microscope to examine the presence or absence of irregularities due to phase separation and the film surface state. The Young's modulus of the film was measured by Nano Hardness Tester manufactured by CSM. The flatness Rq of the film surface was measured by a stylus-type roughness meter (Surfcom 575A-3D, manufactured by Tokyo Seimitsu Co., Ltd.) with a stylus radius of 5 μm. In the measurement of the film thickness, the film on the substrate board was observed from the cross-sectional direction by a scanning electron microscope (JSM-6500F, manufactured by JEOL) and measured for the thickness. In the measurement of the breakdown voltage, after attaching an upper electrode of 1 $cm^2$, an applied voltage was gradually raised at a current threshold value of 1 mA, and the breakdown voltage was evaluated by the insulation up to 1.2 kV. These results are shown in Table 2. With coating solutions of Nos. 1-2 to 1-4, Nos. 1-6 and 1-7, Nos. 1-11 to 1-15 and Nos. 1-18 to 1-21 which are Examples, a flat-surface insulating film could be formed without causing lamellar phase separation and the breakdown voltage was sufficiently high. In No. 1-1 of Comparative Example where Mw of the polydimethylsiloxane was too small, the film thickness was not increased and the breakdown voltage was low. In No. 1-5 of Comparative Example where the molar ratio A/B was small, lamellar phase separation did not occur because of too large an amount of the metal alkoxide that works out to an inorganic component, but cracking was generated in the film. In No. 1-8 of Comparative Example where the molar ratio A/B was small, because of too large an amount of polydimethylsiloxane, lamellar phase separation occurred and, as shown in the photograph of FIG. 1, irregularities were produced in the film surface. At this time, the flatness Rq was beyond the measurement range and could not be measured. In Nos. 1-9 and 1-10 of Comparative Examples using a solvent in which the solubility of water was excessively large, uniform hydrolysis was not brought about, as a result, lamellar phase separation took place after film formation and irregularities were produced in the film surface. In Nos. 1-16 and 1-17 of Comparative Examples using a solvent in which the solubility of water was too small, uniform hydrolysis was not brought about, as a result, lamellar phase separation took place after film formation and irregularities were produced in the film surface. In No. 1-18 of Comparative Example where the solvent amount was too large, a sufficiently thick film was not formed and the breakdown voltage was low. In No. 1-22 of Comparative Example where the solvent amount was excessively small, uniform hydrolysis was not brought about, as a result, lamellar phase separation took place after film formation and irregularities were produced in the film surface. In No. 1-23 of Comparative Example where Mw of the polydimethylsiloxane was too large, the polymer was not dissolved in the organic solvent and a coating solution could not be prepared. In No. 1-24 of Comparative Example, phase separation did not occur and the film was seemingly flat, but the flatness Rq was bad.

| No. | Mw | Molar Ratio A/B | Organic Solvent C | Solubility of Water in 100 g of Solvent C (g/100 g-solvent) | Molar Ratio C/A | Remarks |
|---|---|---|---|---|---|---|
| 1-1 | 700 | 0.25 | $C_4H_8OH$ | 19.8 | 20 | Comparative Example |
| 1-2 | 900 | 0.25 | $C_4H_8OH$ | 19.8 | 20 | Example |
| 1-3 | 5000 | 0.25 | $C_4H_8OH$ | 19.8 | 20 | Example |
| 1-4 | 5000 | 0.05 | $C_4H_8OH$ | 19.8 | 20 | Example |
| 1-5 | 5000 | 0.02 | $C_4H_8OH$ | 19.8 | 20 | Comparative Example |
| 1-6 | 5000 | 0.50 | $C_4H_8OH$ | 19.8 | 20 | Example |
| 1-7 | 5000 | 1.5 | $C_4H_8OH$ | 19.8 | 20 | Example |
| 1-8 | 5000 | 1.8 | $C_4H_8OH$ | 19.8 | 20 | Comparative Example |
| 1-9 | 5000 | 0.25 | $CH_3CH_2OH$ | infinity | 20 | Comparative Example |
| 1-10 | 5000 | 0.25 | $CH_3(CH_2)_5O(CH_2CH_2O)_2H$ | 56.3 | 20 | Comparative Example |
| 1-11 | 3000 | 0.25 | $CH_3(CH_2)_5OCH_2CH_2OH$ | 18.8 | 20 | Example |
| 1-12 | 5000 | 0.25 | $(CH_3)_2CHCH_2OH$ | 16.9 | 20 | Example |
| 1-13 | 5000 | 0.25 | $CH_3(CH_2)_3OCH_2CH(CH_3)OH$ | 6.0 | 20 | Example |
| 1-14 | 5000 | 0.25 | $(CH_3)_2CH(CH_2)_6OH$ | 3.37 | 20 | Example |
| 1-15 | 5000 | 0.25 | $CH_3C(CH_3)_2CH_2CH(CH_3)CH_2CH_2OH$ | 3.03 | 20 | Example |
| 1-16 | 5000 | 0.25 | $CH_3(CH_2)_3CH(CH_2CH_3)CH_2OH$ | 2.68 | 20 | Comparative Example |
| 1-17 | 3000 | 0.25 | $(CH_3)_2CH(CH_2)_7OH$ | 2.48 | 20 | Comparative Example |
| 1-18 | 5000 | 0.25 | $C_4H_8OH$ | 19.8 | 120 | Comparative Example |
| 1-19 | 5000 | 0.25 | $C_4H_8OH$ | 19.8 | 100 | Example |
| 1-20 | 5000 | 0.25 | $C_4H_8OH$ | 19.8 | 1 | Example |
| 1-21 | 5000 | 0.25 | $C_4H_8OH$ | 19.8 | 0.05 | Example |
| 1-22 | 5000 | 0.25 | $C_4H_8OH$ | 19.8 | 0.02 | Comparative Example |
| 1-23 | 12000 | 0.25 | $C_4H_8OH$ | 19.8 | 20 | Comparative Example |
| 1-24 | — | — | $C_2H_5OH$ | infinity | — | Comparative Example |

-continued

| No. | Lamellar Phase Separation | Film Profile | Flatness Rq (nm) | Breakdown Voltage (kV) | Film Thickness (μm) | Remarks |
|---|---|---|---|---|---|---|
| 1-1 | none | flat | 3.8 | 0.5 | 0.3 | Comparative Example |
| 1-2 | none | flat | 4.9 | 1.1 | 2.8 | Example |
| 1-3 | none | flat | 15.0 | 1.4 | 9.3 | Example |
| 1-4 | none | flat | 9.8 | 1.3 | 6.2 | Example |
| 1-5 | none | cracking | 2.5 | — | 1.2 | Comparative Example |
| 1-6 | none | flat | 12.1 | 1.2 | 3.6 | Example |
| 1-7 | none | flat | 16.3 | 1.5 | 8.8 | Example |
| 1-8 | occurred | irregularities | unmeasurable | 1.3 | 12.6 | Comparative Example |
| 1-9 | occurred | irregularities | unmeasurable | 1.5 | 18.6 | Comparative Example |
| 1-10 | occurred | irregularities | unmeasurable | 1.1 | 10.7 | Comparative Example |
| 1-11 | none | flat | 5.3 | 1.2 | 4.5 | Example |
| 1-12 | none | flat | 12.4 | 1.8 | 8.2 | Example |
| 1-13 | none | flat | 10.2 | 1.9 | 8.4 | Example |
| 1-14 | none | flat | 12.5 | 2.1 | 9.8 | Example |
| 1-15 | none | flat | 12.2 | 2.2 | 10.2 | Example |
| 1-16 | occurred | irregularities | unmeasurable | 1.3 | 17.1 | Comparative Example |
| 1-17 | occurred | irregularities | unmeasurable | 1.6 | 18.3 | Comparative Example |
| 1-18 | none | flat | 2.7 | 0.3 | 0.8 | Comparative Example |
| 1-19 | none | flat | 5.8 | 1.1 | 4.8 | Example |
| 1-20 | none | flat | 12.8 | 1.5 | 7.9 | Example |
| 1-21 | none | flat | 16.9 | 2.6 | 9.8 | Example |
| 1-22 | occurred | irregularities | unmeasurable | 1.8 | 15.9 | Comparative Example |
| 1-23 | Polydimethylsiloxane was not dissolved in the solvent and a coating solution could not be prepared. | | | | | Comparative Example |
| 1-24 | none | flat | 30 | 1.5 | 0.5 | Comparative Example |

Example 2

The poly(diorgano)siloxane A (with the terminal group being silanol) and metal alkoxide B shown in Table 3 were used. The mass average molecular weight Mw of the poly(diorgano)siloxane is shown together in Table 3. The molar ratio A/B of the poly(diorgano)siloxane A to 1 mol of the metal alkoxide B was 0.25. n-Butanol ($C_4H_8OH$, solubility of water in 100 g of n-butanol: 19.8 g/100 g) was used as the organic solvent C and the molar ratio C/A of the organic solvent C to 1 mol of the poly(diorgano)siloxane A was set to 20. Ethyl 3-oxobutanoate as a chemical modifier for the metal alkoxide B and the metal alkoxide were mixed in a molar ratio of 2:1, the poly(diorgano)siloxane A was added to the resulting mixture and after further adding the n-butanol solvent to the mixture, $H_2O$ for causing hydrolysis was added to produce a coating solution. The amount of $H_2O$ added here was 2.0 mol per mol of the metal alkoxide.

The coating solution produced through the procedure above was coated on an SUS430 substrate board by dip coating at a pulling rate of 3 mm/sec. After the coating, the coating film was dried at 150° C. and 200° C. each for 10 minutes and then heat-treated at 300° C. for 6 hours to produce an insulating film. The obtained insulating film was evaluated by the same methods as in Example 1. These results are shown in Table 4. With use of any coating solution of Nos. 2-1 to 2-11 of Examples, a flat-surface insulating film could be formed without causing lamellar phase separation and the breakdown voltage was also good.

| No. | Poly(diorgano)siloxane A | Mw | Content of —[Si(CH$_3$)$_2$O]— (mol %) | Metal Alkoxide B M(OR')$_n$ | Remarks |
|---|---|---|---|---|---|
| 2-1 | polydimethylsiloxane | 5000 | 100 | Ca(OC$_2$H$_2$OC$_2$H$_5$)$_2$ | Example |
| 2-2 | polydimethylsiloxane | 5000 | 100 | Y(OC$_3$H$_7$)$_3$ | Example |
| 2-3 | polydimethylsiloxane | 5000 | 100 | Al(OC$_4$H$_9^s$)$_3$ | Example |
| 2-4 | polydimethylsiloxane | 5000 | 100 | Zr(OC$_3$H$_7$)$_4$ | Example |
| 2-5 | polydimethylsiloxane | 5000 | 100 | Sn(OC$_3$H$_7$)$_3$ | Example |
| 2-6 | polydimethylsiloxane | 5000 | 100 | Nb(OC$_2$H$_5$)$_5$ | Example |
| 2-7 | polydimethylsiloxane | 5000 | 100 | Ta(OC$_2$H$_5$)$_5$ | Example |
| 2-8 | polydimethyldiphenylsiloxane | 3000 | 80 | Ti(OC$_3$H$_7^i$)$_3$ | Example |
| 2-9 | polydimethyldiphenylsiloxane | 3000 | 50 | Ti(OC$_3$H$_7^i$)$_3$ | Example |
| 2-10 | polydiphenylsiloxane | 3000 | 0 | Ti(OC$_3$H$_7^i$)$_3$ | Example |
| 2-11 | polydimethyldiethylsiloxane | 3000 | 90 | Ti(OC$_3$H$_7^i$)$_3$ | Example |

| No. | Lamellar Phase Separation | Film Profile | Flatness Rq (nm) | Breakdown Voltage (kV) | Film Thickness (μm) | Remarks |
|---|---|---|---|---|---|---|
| 2-1 | none | flat | 11.6 | 1.8 | 7.7 | Example |
| 2-2 | none | flat | 2.8 | 1.3 | 3.8 | Example |
| 2-3 | none | flat | 2.3 | 1.4 | 4.4 | Example |
| 2-4 | none | flat | 12.3 | 1.9 | 9.8 | Example |
| 2-5 | none | flat | 6.8 | 2.1 | 8.7 | Example |
| 2-6 | none | flat | 8.9 | 1.4 | 5.8 | Example |
| 2-7 | none | flat | 7.6 | 1.2 | 4.3 | Example |
| 2-8 | none | flat | 8.3 | 2.6 | 9.6 | Example |
| 2-9 | none | flat | 6.3 | 1.8 | 8.4 | Example |
| 2-10 | none | flat | 5.8 | 1.7 | 5.8 | Example |
| 2-11 | none | flat | 7.6 | 1.4 | 6.8 | Example |

INDUSTRIAL APPLICABILITY

The substrate coated with a flat-surface insulating film of the present invention can be suitably used as an electrically insulating film-coated substrate requiring flexibility, high breakdown voltage and heat resistance, more specifically, as a substrate coated with a thick insulating film, which is used in the field requiring a surface having very high flatness so as to mount electronic device microcomponents, for example, in an electronic device such as thin-film transistor (TFT), liquid crystal display, organic EL display and electronic paper.

The invention claimed is:

1. A coating solution for forming a flat-surface insulating film, which is a coating solution obtained by dissolving a poly(diorgano)siloxane A having a mass average molecular weight of 900 to 10,000 and a metal alkoxide B in an organic solvent C and further adding water, wherein the molar ratio A/B of the poly(diorgano)siloxane A to 1 mol of the metal alkoxide B is from 0.05 to 1.5, said organic solvent C has a hydroxyl group, the solubility of water in 100 g of the organic solvent C is from 3 to 20 g, and the molar ratio C/A of the organic solvent C to 1 mol of the poly(diorgano)siloxane A is from 0.05 to 100.

2. The coating solution for forming a flat-surface insulating film as claimed in claim 1, wherein the carbon number of said organic solvent C is from 4 to 9.

3. The coating solution for forming a flat-surface insulating film as claimed in claim 1, wherein the metal element of said metal alkoxide B is one or more elements selected from trivalent or tetravalent metal elements.

4. The coating solution for forming a flat-surface insulating film as claimed in claim 1, wherein said poly(diorgano)siloxane A contains a dimethyl siloxane structural unit (—[Si(CH$_3$)$_2$—O]—) in a ratio of 50 to 100% in terms of the molar ratio of Si.

5. The coating solution for forming a flat-surface insulating film as claimed in claim 1, wherein the mass average molecular weight Mw of the poly(diorgano)siloxane A is from 950 to 3,000.

6. The coating solution for forming a flat-surface insulating film as claimed in claim 1, wherein the molar ratio A/B is from 0.2 to 0.8.

7. The coating solution for forming a flat-surface insulating film as claimed in claim 1, wherein the molar ratio C/A is from 0.1 to 60.

8. The coating solution for forming a flat-surface insulating film as claimed in claim 1, wherein the combination of the poly(diorgano)siloxane A and the metal alkoxide B is a combination of a silanol-terminated (both ends) polydimethylsiloxane, a carbinol-terminated (both ends) polydimethylsiloxane, or both a silanol-terminated (both ends) polydimethylsiloxane and a carbinol-terminated (both ends) polydimethylsioloxane, with titanium alkoxide.

9. A production method of a flat-surface insulating film-coated substrate, comprising coating the coating solution for forming a flat-surface insulating film claimed in claim 1 on a substrate, and subjecting the coating to drying at 60 to 200° C. and then to a heat treatment at 250 to 600° C.

10. A flat-surface insulating film-coated substrate comprising a substrate having coated on the surface thereof an organic modified silicate insulating film formed from a poly(diorgano)siloxane A having a mass average molecular weight of 900 to 10,000 and a metal alkoxide B, wherein the molar ratio A/B of the poly(diorgano)siloxane B to 1 mol of said metal alkoxide A is from 0.05 to 1.5, the thickness of said film is from 1 to 50 μm, the Young's modulus of said film is from 10 to 10$^3$ MPa, and the surface flatness Rq of said film is 20 nm or less.

11. The flat-surface insulating film-coated substrate as claimed in claim 10, wherein the poly(diorgano)siloxane contained in said organic modified silicate insulating film contains a dimethylsiloxane structural unit (—[Si(CH$_3$)$_2$—O]—) in a ratio of 50 to 100% in terms of the molar ratio of Si.

* * * * *